US012719375B2

(12) United States Patent
Bottarel et al.

(10) Patent No.: US 12,719,375 B2
(45) Date of Patent: Aug. 25, 2026

(54) GATE DRIVER CIRCUIT

(71) Applicant: NXP USA, Inc., Austin, TX (US)

(72) Inventors: Valeria Bottarel, Novara (IT); Lorenzo Groppo, Sommariva del Bosco (IT); Ibrahim Shihadeh Kandah, Novi, MI (US)

(73) Assignee: NXP USA, Inc., Austin, TX (US)

( * ) Notice: Subject to any disclaimer, the term of this patent is extended or adjusted under 35 U.S.C. 154(b) by 8 days.

(21) Appl. No.: 19/068,163

(22) Filed: Mar. 3, 2025

(65) Prior Publication Data

US 2025/0286463 A1 Sep. 11, 2025

(30) Foreign Application Priority Data

Mar. 5, 2024 (EP) .................................... 24161357

(51) Int. Cl.
*H02M 3/335* (2006.01)
*H02M 1/00* (2006.01)
*H03K 17/687* (2006.01)

(52) U.S. Cl.
CPC ..... *H02M 3/33523* (2013.01); *H02M 1/0035* (2021.05); *H02M 1/0045* (2021.05); *H03K 17/687* (2013.01)

(58) Field of Classification Search
CPC ........... H02M 3/33523; H02M 1/0035; H02M 1/0045; H02M 1/0006; H02M 3/33507; H02M 3/33515; H02M 3/33561; H02M 1/08; H03K 17/687; H03K 17/18; H03K 17/063
USPC .......................................................... 327/109
See application file for complete search history.

(56) References Cited

U.S. PATENT DOCUMENTS

| | | | | |
|---|---|---|---|---|
| 8,049,438 B2 * | 11/2011 | Liu | .................... | H05B 41/2828 315/210 |
| 10,243,469 B1 * | 3/2019 | Liu | ......................... | H02M 3/24 |
| 2009/0284994 A1 * | 11/2009 | Lin | .................. | H02M 3/33507 363/21.13 |
| 2014/0092647 A1 * | 4/2014 | Ren | .................. | H02M 3/33553 363/21.17 |

(Continued)

OTHER PUBLICATIONS

Infineon, "EiceDRIVER™ gate driver 1EDI3051AS, Single channel isolated IGBT/SiC-MOSFET driver", Datasheet, Rev. 1.0, May 2023.

(Continued)

*Primary Examiner* — Ryan Jager

(57) ABSTRACT

A driver circuit for controlling a high-power switch. The driver circuit comprises a flyback converter and a driving stage. The flyback converter includes a controller that configured to: receive a PWM control signal, which is for controlling the high-power switch; receive a feedback voltage signal, representative of a measured voltage of a positive output rail or the negative output rail of the flyback converter; and provide a primary-side switch control signal that comprises a bursts of pulses for operating the primary switch, wherein the controller is configured to start a burst of pulses in response to an edge of the PWM control signal, and stop the burst of pulses in response to the feedback voltage crossing a threshold. The driving stage is connected between the positive output rail and the negative output rail. The driving circuit is configured to provide a high-power switch control signal for controlling the state of the high-power switch based on the PWM control signal.

20 Claims, 6 Drawing Sheets

(56) References Cited

U.S. PATENT DOCUMENTS

| | | | | |
|---|---|---|---|---|
| 2016/0043647 | A1* | 2/2016 | Rapisarda | H02M 3/33523 363/21.12 |
| 2019/0260284 | A1* | 8/2019 | Liu | H02M 1/15 |
| 2019/0341852 | A1 | 11/2019 | Fahlenkamp et al. | |
| 2023/0019116 | A1* | 1/2023 | Cacciotto | H02M 1/08 |
| 2025/0286463 | A1* | 9/2025 | Bottarel | H02M 3/33523 |
| 2025/0337401 | A1* | 10/2025 | Bottarel | H03K 17/04106 |
| 2026/0023632 | A1* | 1/2026 | Hoermaier | G06F 11/0739 |
| 2026/0058537 | A1* | 2/2026 | Agrawal | H02M 1/0035 |

OTHER PUBLICATIONS

Kolincio, M., "Multitransformer Primary-Side Regulated Flyback Converter for Supplying Isolated IGBT and MOSFET Drivers", IEEE Transactions on Industrial Electronics, vol. 67, No. 2, Feb. 2020.

Rohm Semiconductor, "Isolation Voltage 2500 Vrms 1ch Gate Driver Providing Galvanic Isolation", BM60060FV-C, Datasheet, Rev.001, Mar. 2019.

ST Microelectronics, "Automotive advanced isolated gate driver for IGBTs and SiC MOSFETs", STGAP4S Datasheet, Rev. 4, Mar. 2023.

* cited by examiner

530

ADAPTIVE_CTRL_DIS = 1
SHUNT_DIG_MASK = X

532

ADAPTIVE_CTRL_DIS = 0
SHUNT_DIG_MASK = 0

531

ADAPTIVE_CTRL_DIS = 0
SHUNT_DIG_MASK = 1

STEADY-STATE
*burst_req = 0*

VCC_UB=1
or
VCC_VEE_UB=1

VCC_LB=1
or
VCC_VEE_LB=1

STANDARD BURST
*burst_req = 1*

VCC_UB=1
or
SHUNT_DIG=1

VCC_LB=1
or
PWM turn-off

ADAPTIVE BURST
(w/SHUNT_DIG)
*burst_req = 1*

VCC_UB=1

VCC_LB=1
or
PWM turn-off

ADAPTIVE BURST
(w/o SHUNT_DIG)
*burst_req = 1*

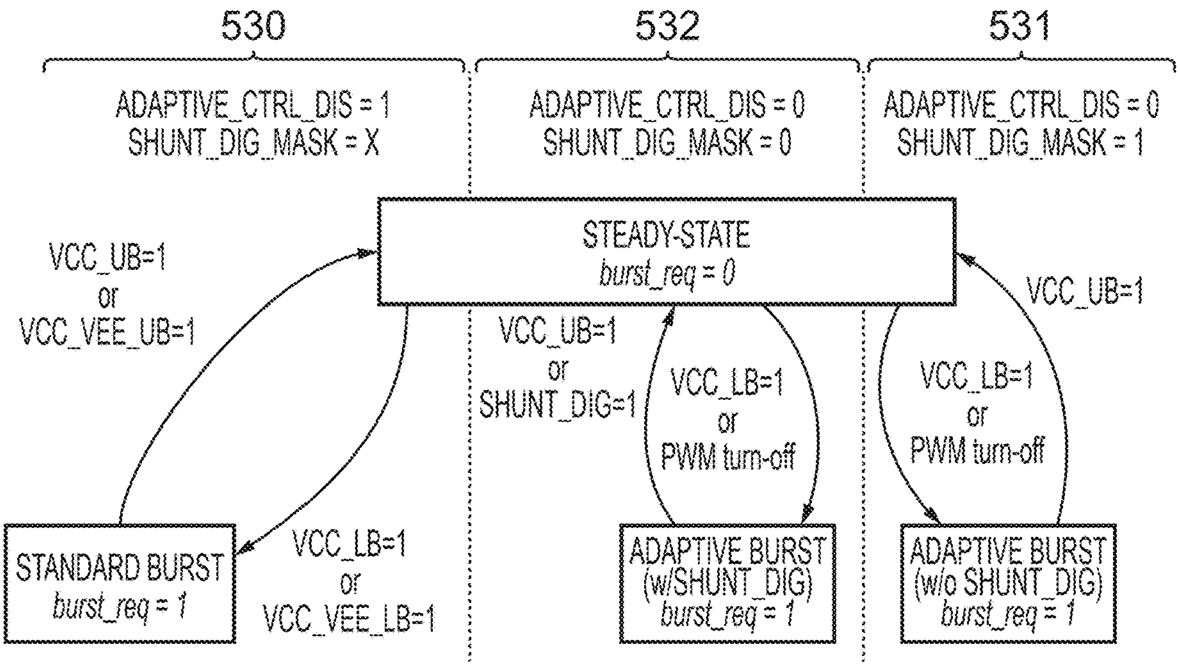

FIG. 5a

ADAPTIVE_CTRL_DIS = 1

VCC_UB

VCC_LB

STANDARD BURST
*burst_req* SET *on* VCC_LB *or* VCC_VEE_LB
*burst_req* RESET *on* VCC_UB *or* VCC_VEE_UB

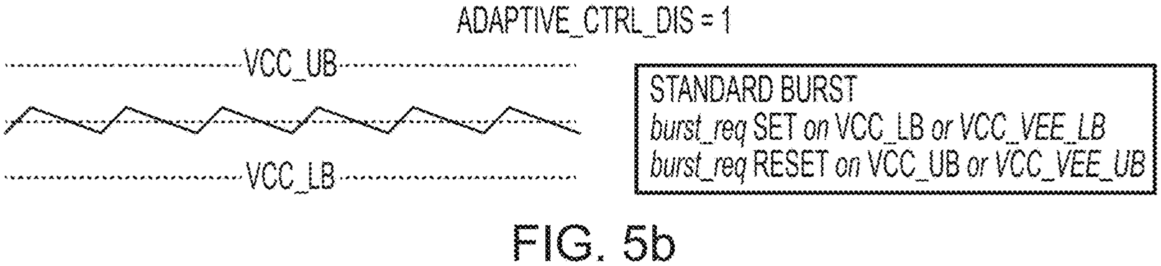

FIG. 5b

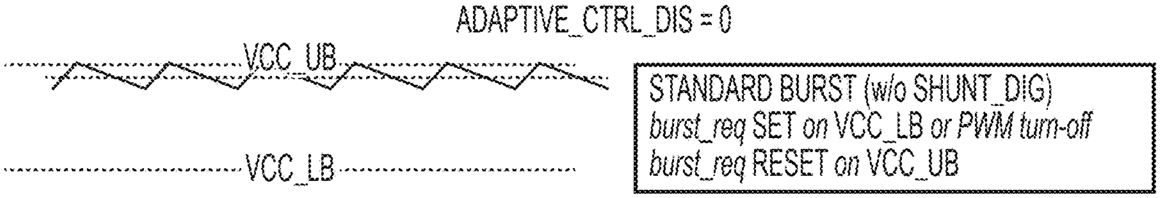

FIG. 5c

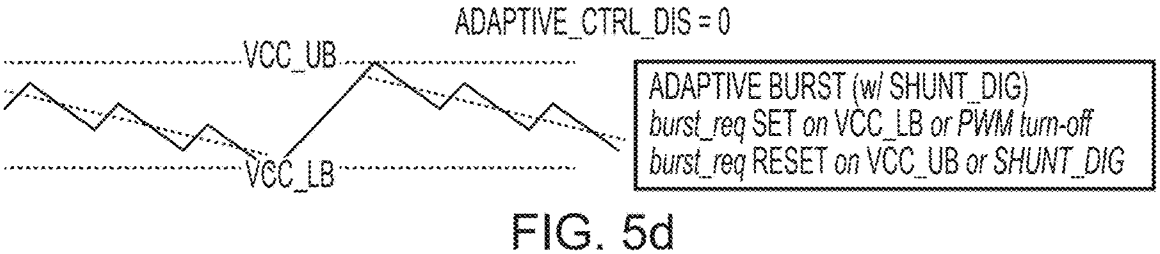

FIG. 5d

GATE DRIVER CIRCUIT

CROSS-REFERENCE TO RELATED APPLICATIONS

This application claims the priority under 35 U.S.C. § 119 of European Patent application no. 24161357.9, filed on 5 Mar. 2024, the contents of which are incorporated by reference herein.

FIELD

The present disclosure relates to a gate driver circuit, and in particular to an isolated gate driver circuit that is suitable for driving the gate of a high-power switch such as those found in inverters in electric vehicles.

SUMMARY

According to a first aspect of the present disclosure there is provided a driver circuit for controlling a high-power switch, the driver circuit comprising:

- a flyback converter, comprising:
  - a primary switch;
  - a positive output rail, which is configured to provide a positive output voltage;
  - a negative output rail, which is configured to provide a negative output voltage; and
  - a controller configured to:
    - receive a PWM control signal, which is for controlling the high-power switch;
    - receive a feedback voltage signal, representative of a measured voltage of the positive output rail or the negative output rail; and
    - provide a primary-side switch control signal that comprises a bursts of pulses for operating the primary switch, wherein the controller is configured to start a burst of pulses in response to an edge of the PWM control signal, and stop the burst of pulses in response to the feedback voltage crossing a threshold;
- a driving stage that is connected between the positive output rail and the negative output rail, wherein the driving circuit is configured to provide a high-power switch control signal for controlling the state of the high-power switch based on the PWM control signal.

Advantageously, using an edge of the PWM control signal to start a burst can improve the performance of the gate driver circuit. This is because the primary switch can be operated more quickly in response to an edge of the PWM control signal, rather than waiting for the effects of that edge being reflected in the feedback voltage signal.

In one or more embodiments, the feedback voltage is representative of a measured voltage of the positive output rail. The controller may be configured to:

- start the burst in response to either:
  - i) a falling edge of the PWM control signal, or
  - ii) the feedback voltage being less than a lower threshold, and
- stop the burst in response to the feedback voltage exceeding an upper threshold.

In one or more embodiments, the flyback converter comprises: a flyback transformer that has a primary winding and a secondary winding. The flyback converter may also comprise a shunt regulator that is configured to provide the negative output voltage as a regulated version of a negative voltage at the secondary winding of the flyback transformer.

In one or more embodiments, the flyback converter further comprises: an LDO voltage regulator that is configured to provide the positive output voltage as a regulated version of a positive voltage at the secondary winding of the flyback transformer.

In one or more embodiments, the controller is further configured to:

- receive a shunt-active-signal that represents whether or not the shunt regulator is active; and
- stop the burst in response to either:
  - the feedback voltage exceeding the upper threshold; or
  - the shunt-active-signal having a value that represents that the shunt regulator is active.

In one or more embodiments, the feedback voltage is representative of a measured voltage of the negative output rail. The controller may be configured to:

- start the burst in response to either:
  - i) a rising edge of the PWM control signal, or
  - ii) the feedback voltage) dropping below a lower threshold; and
- stop the burst the feedback voltage being greater than an upper threshold.

In one or more embodiments, the controller is configured to:

- receive a flyback clock signal;
- provide a burst-enable signal, which is: set to a first value when the controller starts a burst; and is set to a second value when the controller stops a burst; and
- selectively provide the flyback clock signal as the primary-side switch control signal for the primary switch based on the value of the burst-enable signal.

In one or more embodiments:

- the flyback converter has a primary side and a secondary side;
- the controller comprises a primary-side controller on the primary side of the flyback converter;
- the controller comprises a secondary-side controller on the secondary side of the flyback converter; and
- the driver circuit further comprises a galvanically-isolated communication layer that is configured to communicate signalling from the secondary-side controller to the primary-side controller.

In one or more embodiments, the secondary-side controller is configured to:

- determine the burst-enable signal; and
- send the determined burst-enable signal to the primary-side controller via the galvanically-isolated communication layer.

In one or more embodiments, the secondary-side controller is configured to:

- send the determined burst-enable signal to the primary-side controller via the galvanically-isolated communication layer such that it is time division multiplexed with other data.

In one or more embodiments, the other data represents a measurement associated with the secondary side.

In one or more embodiments, the flyback converter comprises: a flyback transformer that has a primary winding and a single secondary winding.

In one or more embodiments, the flyback converter comprises:

- a positive rail capacitor;
- a negative rail capacitor; and
- a diode.

The positive rail capacitor and the diode may be connected in series with each other between a first terminal of the secondary winding of the flyback transformer and a reference terminal; and the negative rail capacitor may be connected in series between a second terminal of the secondary winding of the flyback transformer and the reference terminal.

The positive rail capacitor may be connected in series between a first terminal of the secondary winding of the flyback transformer and a reference terminal; and the negative rail capacitor and the diode may be connected in series with each other between a second terminal of the secondary winding of the flyback transformer and the reference terminal.

In one or more embodiments, the primary switch is connected in series with the primary winding of the flyback transformer between a voltage source for the primary side and a reference terminal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIG. 5*a* shows a representation of three different state machines that can be implemented by the secondary-side controller of FIG. 1;

FIGS. 5*b*-5*d* shows plots of VCC for the three different state machines of FIG. 5*a;*

DETAILED DESCRIPTION

Inverters that are used in electric vehicles (EVs), for example, can use isolated gate driver ICs (integrated circuits). These gate driver ICs can include an isolated flyback converter to supply its high voltage side, instead of using an external controller. Some safety cases can use an independent controller for each inverter branch.

Figure 1:
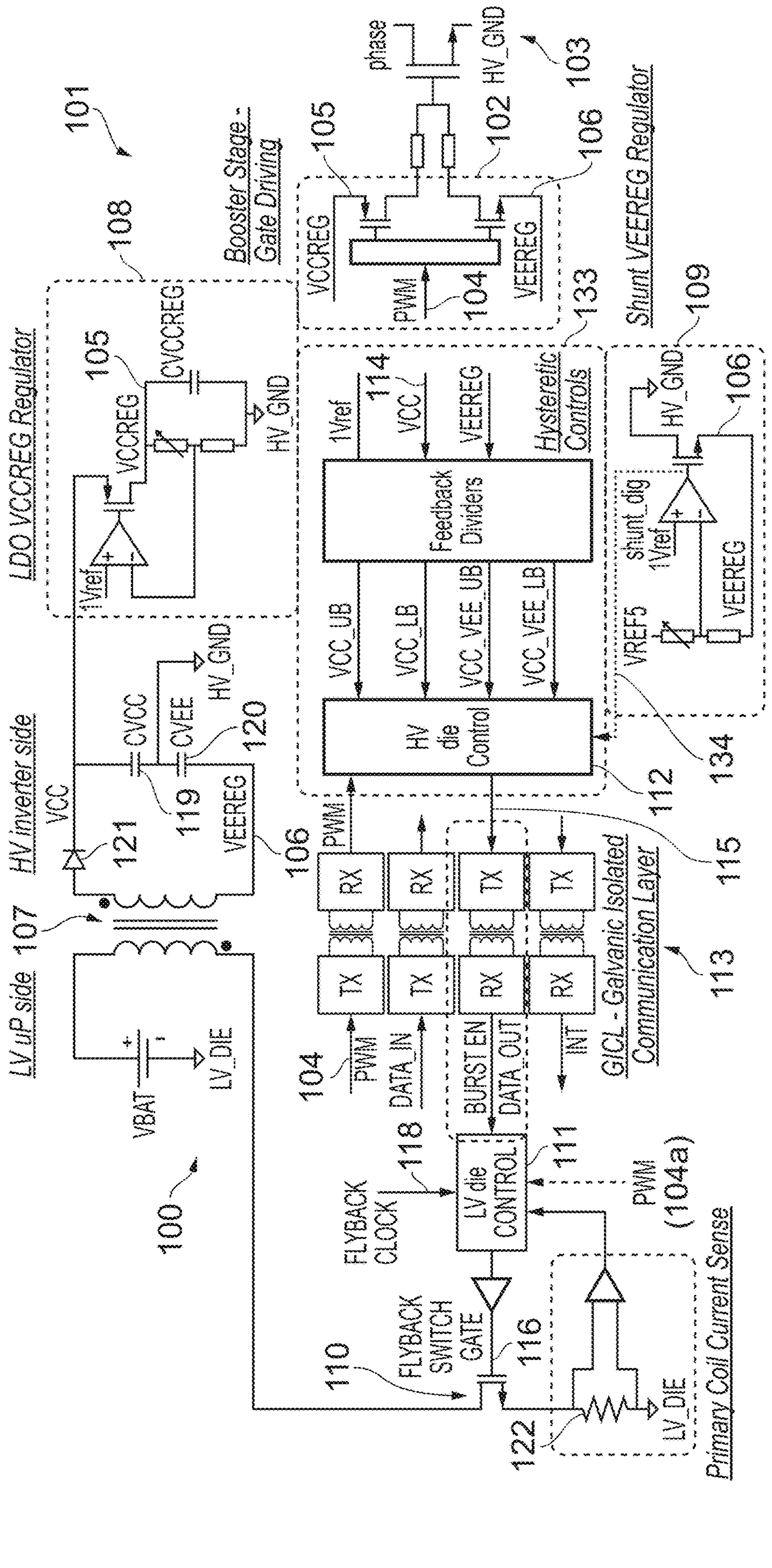
FIG. 1 shows an example of a gate driver circuit according to an embodiment of the present disclosure.

FIG. 1 shows an example of a gate driver circuit 100 according to an embodiment of the present disclosure. The gate driver circuit 100 is for driving the gate of a high-power switch 103, such as the ones that are found in inverters in electric vehicles. As will be discussed in detail below, the state of the high-power switch 103 is controlled based on a PWM (pulse width modulation) signal 104.

The gate driver circuit 100 includes a flyback converter 101 and a gate driving stage 102. The flyback converter 101 includes a primary switch 110 and a flyback transformer 107, which has a primary winding and a secondary winding. The flyback transformer 107 provides galvanic isolation between a primary side of the flyback converter 101 and a secondary side of the flyback converter 101. In the example of FIG. 1, the primary side of the flyback converter 101 is a relatively low-voltage side that is connected to a microprocessor. The secondary side of the flyback converter 101 is a relatively high-voltage side that is connected to the gate driving stage 102 of the high-power switch 103, which represents one power device in a half bridge in order to drive each one of the phases of an inverter system.

The secondary winding of the flyback transformer 107 provides a positive output voltage (VCC) for a positive output voltage rail 105, and it also provides a negative output voltage (VEE) for a negative output voltage rail 106. The flyback converter 101 also includes: a positive rail capacitor (CVCC) 119; a negative rail capacitor (CVEE) 120; and a diode 121. The positive rail capacitor (CVCC) 119 and the diode 121 are connected in series with each other between a first terminal of the secondary winding of the flyback transformer 107 and a reference terminal (HV_GND). The negative rail capacitor (CVEE) 120 is connected in series between a second terminal of the secondary winding of the flyback transformer 107 and the reference terminal (HV_GND).

As will be discussed in detail below, in the example of FIG. 1, the flyback converter 101 includes a LDO (low-dropout) voltage regulator 108 associated with the positive output voltage rail 105. The LDO voltage regulator 108 provides the positive output voltage as a regulated version of the positive voltage (VCC) at the secondary winding of the flyback transformer 107. This regulated version of the positive output voltage is labelled as VCCREG in FIG. 1. Also in the example of FIG. 1, the flyback converter 101 includes a shunt regulator 109 associated with the negative output voltage rail 106. The shunt regulator 109 is configured to provide the negative output voltage as a regulated version of the negative voltage (VEE) at the secondary winding of the flyback transformer 107. This regulated version of the negative output voltage is labelled as VEEREG in FIG. 1.

The gate driving stage 102 is connected between the positive output rail 105 and the negative output rail 106. It provides a high-power switch control signal for controlling the state of the high-power switch 103 based on the PWM control signal 104. In this example, the high-power switch is a FET that has a gate terminal for controlling the conductivity of a conduction channel between a source terminal and a drain terminal of the FET. The gate driving stage 102 therefore provides a gate control signal to the high-power switch 103. In the example of FIG. 1 the gate control signal has a voltage based on either the positive output voltage (VCCREG) on the positive output voltage rail 105 or the negative output voltage (VEEREG) on the negative output voltage rail 106, depending upon whether the high-power switch 103 is to be open or closed.

The flyback converter 101 also includes a controller. In FIG. 1, the functionality of the controller that will be described herein can be performed by a primary-side controller 111 and/or a secondary-side controller 112. The primary-side controller 111 and the secondary-side controller 112 are in communication with each other via a galvanically-isolated communication layer 113, as shown in FIG. 1. It will be appreciated that the galvanically-isolated communication layer 113 can be implemented in any of a number of known ways, such as: using transformers, as shown in FIG. 1; using opto-couplers; or using any other suitable components. We will initially describe the secondary-side controller 112 as performing the majority of the functionality of the controller. However, as indicated, some or all of the functionality can be performed by the primary-side controller 111.

The secondary-side controller 112 receives the PWM control signal 104, which, as discussed above, is for controlling the high-power switch 103. In this example, the PWM control signal 104 is provided by a microprocessor that is associated with the primary side of the flyback converter 101. The PWM control signal 104 is communicated to the secondary-side controller 112 via the galvanically-isolated communication layer 113.

The secondary-side controller 112 also receives a feedback voltage signal 114, which is representative of a measured voltage of the positive output rail 105 or the negative output rail 106. In this example, the feedback voltage signal 114 is the positive output voltage (VCC) at the secondary winding of the flyback transformer 107. In other examples, that will be briefly discussed below, the feedback voltage signal 114 can be the negative output voltage (VEE) at the secondary winding of the flyback transformer 107. In further examples still, the feedback voltage signal 114 can be: a shunt regulated version of the negative voltage (VEE) at the secondary winding of the flyback transformer 107, which is shown in FIG. 1 as VEEREG; or a shunt regulated version of the positive voltage (VCC) at the secondary winding of the flyback transformer 107, which is not present in the example of FIG. 1. This is because a shunt regulator is a parallel regulator, and therefore the input voltage of the regulator is equal to the output voltage of the regulator.

The primary switch 110 is controllable according to a burst mode of operation, such that its gate is provided with a primary-side switch control signal 116 that includes bursts of pulses to transfer energy from the primary side of the flyback transformer 107 to the secondary side of the flyback transformer 107. In between the bursts of pulses, the state of the primary switch 110 is not changed such that no energy is transferred across the flyback transformer 107. Burst modes of operation are known in the art.

The secondary-side controller 112 provides a burst-enable signal 115, which is: set to a first value when the controller starts a burst; and is set to a second, different, value when the controller stops a burst. In the example of FIG. 1, this burst-enable signal 115 is communicated from the secondary-side controller 112 to the primary-side controller 111 across the galvanically-isolated communication layer 113. The primary-side controller 111 also receives a flyback clock signal 118, which has a constant frequency and duty cycle in this example. The primary-side controller 111 selectively provides the flyback clock signal 118 as primary-side switch control signal 116 for the primary switch 110 based on the value of the burst-enable signal 115.

In this example, the primary switch 110 is connected in series with the primary winding of the flyback transformer 107 between a voltage source (VBAT) for the primary side and a reference terminal (LV_DIE). In this example, the voltage source (VBAT) for the primary side is a battery. In FIG. 1, a sense resistor 122 is also connected in series with the primary switch 110, such that a sensed current from the primary side of the flyback transformer 107 is provided to the primary-side controller 111. In this way, the primary-side controller 111 can optionally also use the sensed primary current when determining the primary-side switch control signal 116. For example, the primary-side controller 111 can set the duty cycle of each pulse in the bursts based on the sensed primary current.

Figure 2:
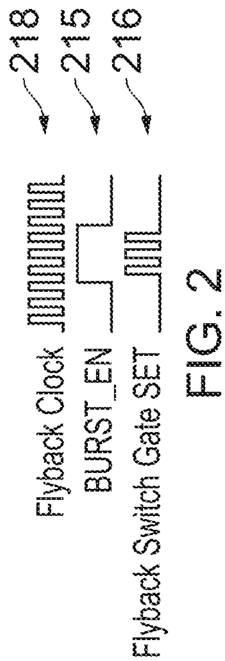
FIG. 2 shows an example plot of the flyback clock signal, the burst-enable signal, and the primary-side switch control signal of FIG. 1.

FIG. 2 shows an example plot of the flyback clock signal 218, the burst-enable signal 215, and the primary-side switch control signal 216 of FIG. 1. As can be seen, the burst-enable signal 215 is applied to the flyback clock signal 218 as a mask to generate the primary-side switch control signal 216.

Returning to FIG. 1, as we will now describe in detail, advantageously the primary-side controller 111 and the secondary-side controller 112 of FIG. 1 provide the switch control signal 116 for the primary switch 110 as a burst of pulses, in order to either:

- start a burst of pulses in response to an edge of the PWM control signal 104 (which can be a rising edge or a falling edge), and stop the burst of pulses in response to the feedback voltage 114 crossing a threshold; or
- start the burst of pulses in response to the feedback voltage 114 crossing a threshold, and stop the burst of pulses in response to the feedback voltage 114 crossing a different threshold.

Using an edge of the PWM control signal 104 to start a burst can improve the performance of the gate driver circuit 100. This is because the primary switch 110 can be operated more quickly in response to an edge of the PWM control signal 104, rather than waiting for the effects of that edge being reflected in the feedback voltage signal 114. That is, the primary-side controller 111 (on the low voltage side of the flyback converter 101) can foresee load pulses by monitoring the PWM control signal 104 that is provided by the microprocessor, in such a fashion that it can anticipate flyback activities directly in the LV Domain (at the primary-side controller 111). In the example of FIG. 1, the PWM control signal 104 is provided from the primary side of the flyback converter 101 to the secondary-side controller 112, and the secondary-side controller 112 then provides the burst-enable signal 115 to the primary-side controller 111. In an alternative example, the primary-side controller 111 can directly process the PWM control signal (as shown with a dashed line, 104*a*, FIG. 1) in order to determine the burst-enable signal. Either way, the voltages on the positive output voltage rail 105 and the negative output voltage rail 106 can be more accurately controlled, as we will discuss in detail below. In this way, the control scheme for the flyback converter 101 can exploit the fact that the principle loading of the output occurs on PWM rising and falling edges. Therefore, the control of the primary switch 110 can utilize both feedback and the available PWM information in the PWM control signal 104.

The initial description that follows is for the first of the above bullet points, where a burst of pulses can be started in response to an edge of the PWM control signal 104. We will then describe the second bullet point, where a burst of pulses can be stopped in response to the feedback voltage signal 114 crossing a threshold or a shunt_dig signal 134.

Figure 3:
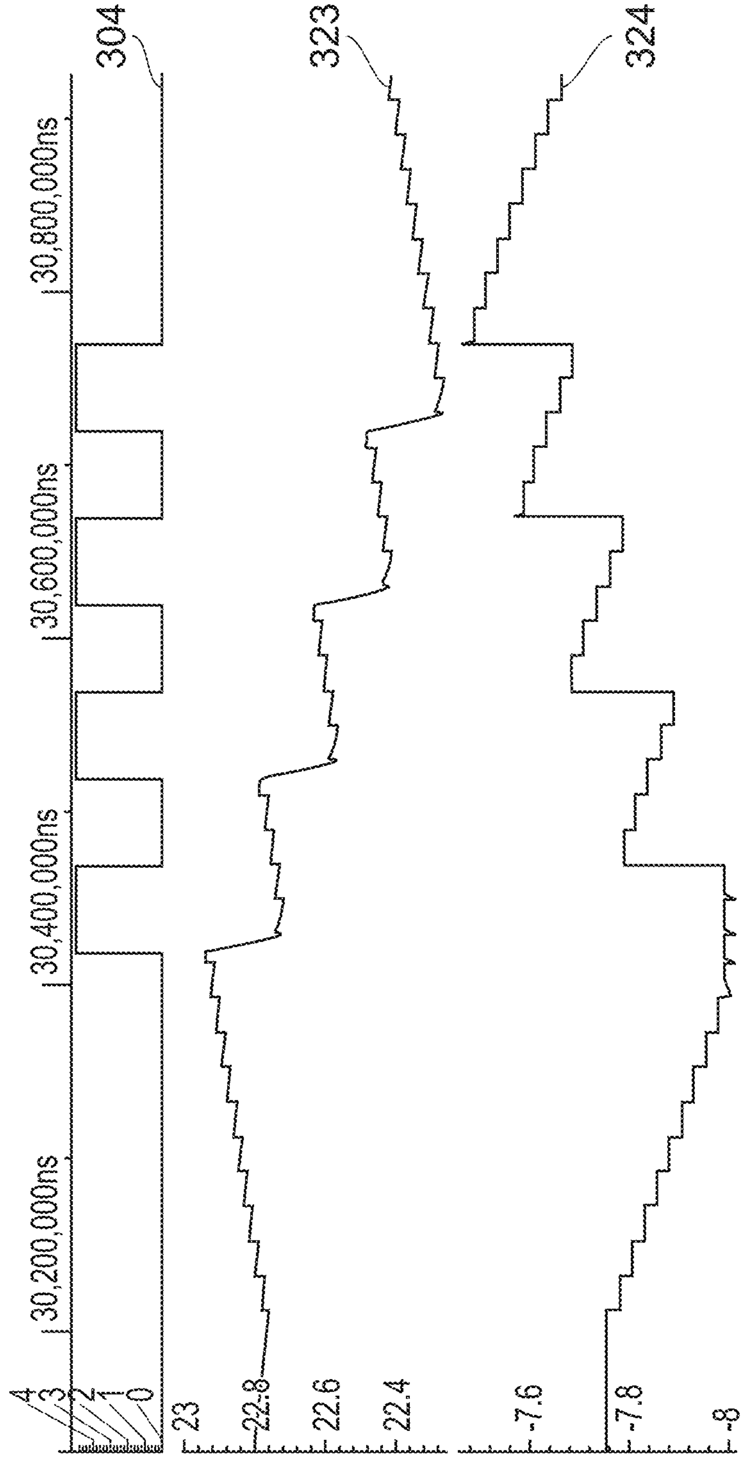
FIG. 3 shows a plot of various signals in the gate driver circuit of FIG. 1.

FIG. 3 shows a plot of the following signals in the gate driver circuit of FIG. 1:

the PWM control signal 304;

the positive voltage at the secondary winding of the flyback transformer (VCC) 323; and the negative voltage at the secondary winding of the flyback transformer (VEE) 324.

The plots of FIG. 3 show how the rising edges of the PWM control signal 304 indicate a pulse load on the positive voltage at the secondary winding of the flyback transformer (VCC) 323, which results in a discharge of the positive rail capacitor (CVCC). The plots of FIG. 3 also show how the falling edges of the PWM control signal 304 indicate a pulse load on the negative voltage at the secondary winding of the flyback transformer (VEE) 324, which results in a discharge of the negative rail capacitor (CVEE). The load on the secondary side of the flyback transformer in the HV domain has mainly a load step behavior due to the charge needed to drive a large power device gate according to a PWM signal. Especially where the power device is used for spinning a motor, which in one example is the case for a traction inverter with a small DC component (the gate driver die quiescent current).

Figure 4:
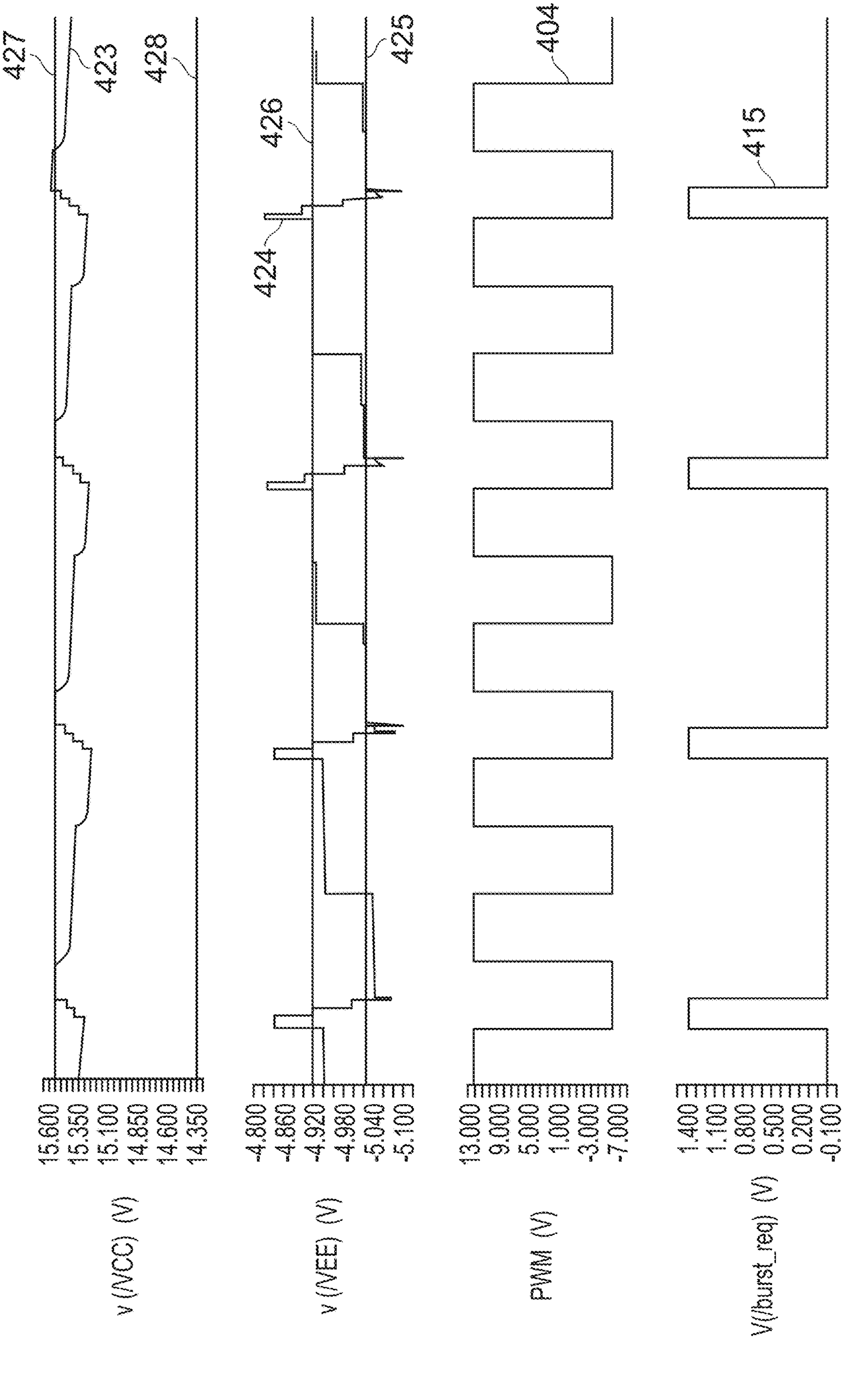
FIG. 4 shows another plot of the signals in the gate driver circuit of FIG. 1.

In the implementation of FIG. 1, as indicated above, the positive output voltage of the secondary winding (VCC) is post-regulated to VCCREG by a LDO voltage regulator 108 to supply the booster stage of the gate driving stage 102. The shunt VEE regulator 109 is effective to ensure that VEEREG does not go more negative than its regulation point. Falling edges of the PWM control signal 104 results in some charge loss on the negative rail capacitor (CVEE) 120, causing VEE level to go too positive with respect to its regulation point. (This is illustrated in FIG. 4.) Therefore, in the example of FIG. 1, the falling edges of the PWM control signal 104 are used to trigger a primary side burst.

FIG. 4 shows another plot of the signals in the gate driver circuit of FIG. 1. For the simulation of FIG. 4, an edge of the PWM control signal is not used to start a burst. Instead, hysteretic control is performed by comparing a feedback voltage to upper and lower thresholds.

For FIG. 4, VEE=−5V, VCCREG=14V, and Cload=100 nF. Where Cload is the capacitance of the load (i.e., the external power device which is being driven). CVEE can be chosen properly (e.g. CVEE=20 uF) to meet a 2% ripple performance target after one PWM falling edge.

The plots in FIG. 4 show:

VCC 423, along with: a plot 427 that shows the upper band (VCC_UB) of the hysteretic control of VCC; and a plot 428 that shows the lower band (VCC_LB) of the hysteretic control of VCC;

VEE 424, along with: a plot 425 that shows the setpoint of VEE of −5V; and a plot 426 that shows the 2% ripple performance target;

the PWM control signal 404; and the burst-enable signal 415.

Despite the bill of materials (BOM) being selected appropriately, the simulation results of FIG. 4 show that the ripple in VEE 424 exceeds the 2% performance target 426. This is because the frequency of the burst-enable signal 115 is lower than the frequency of the PWM control signal when standard hysteretic control is used. This can depend on the value of the positive rail capacitor (CVCC) and hysteresis choices (vhyst). In this example, allowed values in the range are: CVCC=20 uF; and vhyst=+/−600 mV. We can also observe the error on VEE 424 in the 0V side (i.e., VEE 424 more negative than the setpoint 425). This performance, related to amplitude more negative than setpoint, depends on the gain and bandwidth of an error amplifier, which drives a shunt MOS gate in the shunt regulator 109, and the ratio between the current peak on the secondary winding of the flyback transformer 107 and the selected value of the negative rail capacitor (CVEE).

FIG. 5*a* shows a representation of three different state machines that can be implemented by the secondary-side controller of FIG. 1.

Before FIG. 5*a* is described in detail, we will return to FIG. 1 to introduce the signals that are shown in FIG. 5*a*. The flyback converter 101 of FIG. 1 includes a hysteretic control block 133, which includes the secondary-side controller 112 that has been described above.

The hysteretic control block 133 also includes a feedback dividers block. The feedback dividers block in this example includes resistive dividers and comparators (not shown). As will be appreciated from the description that follows, the resistive dividers can provide divided versions of feedback signals that are received by the feedback dividers block, and the comparators can provide output signals that represent whether or not a feedback signal has crossed a threshold. Depending on whether the threshold is an upper threshold or a lower threshold, a threshold crossing can occur when the feedback voltage becomes less than or greater than the threshold.

In FIG. 1, the feedback dividers block receives the positive output voltage (VCC) at the secondary winding of the flyback transformer 107 as a feedback voltage signal 114. The feedback dividers block also receives the regulated version of the negative output voltage (VEEREG). Further still, the feedback dividers block receives a 1Vref signal, which is an on-chip reference signal that is used to define the hysteresis bands.

In the example of FIG. 1, the feedback dividers block provides the following four output signals to the secondary-side controller 112:

VCC_UB, which is representative of whether or not the received positive output voltage (VCC) at the secondary winding of the flyback transformer 107, with reference to ground, is greater than an upper band (UB) threshold. In this example, VCC_UB has a value of 1 when VCC is greater than the UB threshold;

VCC_LB, which is representative of whether or not the received positive output voltage (VCC) at the secondary winding of the flyback transformer 107, with reference to ground, is less than a lower band (LB) threshold. In this example, VCC_LB has a value of 1 when VCC is less than the LB threshold;

VCC_VEE_UB, which is representative of whether or not the received positive output voltage (VCC) at the secondary winding of the flyback transformer 107, with reference to the negative voltage (VEE) at the secondary winding of the flyback transformer 107, is greater than an upper band (UB) threshold. In this example, VCC_VEE_UB has a value of 1 when VCC−VEE is greater than the UB threshold; and VCC_VEE_LB, which is representative of whether or not the received positive output voltage (VCC) at the secondary winding of the flyback transformer 107, with reference to the negative voltage (VEE) at the secondary winding of the flyback transformer 107, is less than a lower band (LB) threshold. In this example, VCC_VEE_UB has a value of 1 when VCC−VEE is less than the LB threshold.

It will be appreciated that the UB thresholds are higher than their respective LB thresholds, such that hysteretic control is applied.

The secondary-side controller 112 also receives a shunt_dig signal 134 from the shunt regulator 109. The shunt_dig signal 134 represents whether or not the shunt regulator 109 is active, and therefore can also be referred to as a shunt-active-signal. The shunt_dig signal 134 in this example has a value of 1 when the shunt regulator 109 is active, and it has a value of 0 when the shunt regulator 109 is not active. It will be appreciated that the shunt regulator 109 is active when the negative voltage at the secondary winding of the flyback transformer 107 (VEE) is too low (i.e., VEE is less than its set point).

The output signals from the feedback dividers block and also the shunt_dig signal 134 are used by one or more of the state machines of FIG. 5*a*. It will be appreciated from the description that follows that, in other examples, different feedback voltage signals can be used such that correspondingly different thresholds can be applied and therefore different output signals can be provided.

Returning now to FIG. 5*a*, the left-hand part of FIG. 5*a* represents a state machine 530 that does not use an edge of the PWM control signal to start or stop a burst of pulses. Instead, only hysteretic control is applied. In the present disclosure, this can be referred to as not using adaptive control. As shown in the figure, a burst is started by setting the burst-enable signal to 1 when either: VCC_LB=1 or VCC_VEE_LB=1. That is, when either the positive output voltage rail or the differential voltage (i.e., the voltage between said positive output rail and the negative output voltage rail) become too low. For this state machine 530, a burst is stopped by setting the burst-enable signal to 0 when either: VCC_UB=1 or VCC_VEE_UB=1. That is, when either the positive output voltage rail or the differential voltage (i.e., the voltage between said positive output rail and the negative output voltage rail) become too high.

FIG. 5*b* shows a plot of VCC, with reference to VCC_UB and VCC_LB, when the left-most state machine 530 of FIG. 5*a* is applied.

Returning again to FIG. 5*a*, the right-hand part of FIG. 5*a* represents a state machine 531 that can use an edge of the PWM control signal to start a burst of pulses. In the present disclosure, this can be referred to as using adaptive control. As shown in the figure, a burst is started by setting the burst-enable signal to 1 when either: VCC_LB=1 or "PWM turn-off". That is, when either the voltage on the positive output voltage rail becomes too low or when a falling edge of the PWM control signal occurs. For this state machine 531, a burst is stopped by setting the burst-enable signal to 0 when VCC_UB=1. That is, when the voltage on the positive output voltage rail becomes too high. In this way, the state machine 531 can use the PWM control signal instead of using any feedback voltage that represents VEE (as is used by the left-most state machine 530 in FIG. 5). VCC can still be regulated by the associated hysteresis band in this example. That is, if VCC drops below VCC_LB before a falling edge in the PWM control signal occurs. It is recalled that the post-regulation of VCC that is performed by the LDO voltage regulator of FIG. 1 will provide precise VCCREG to the gate driver stage.

In this way, the feedback voltage is representative of a measured voltage of the positive output rail (VCC); and the controller:

- starts the burst in response to either:
  - i) a falling edge of the PWM control signal, or
  - ii) the feedback voltage (VCC) being less than a lower threshold (VCC_LB), and
- stops the burst in response to the feedback voltage (VCC) exceeding an upper threshold (VCC_UB).

FIG. 5*c* shows a plot of VCC, with reference to VCC_UB and VCC_LB, when the right-most state machine 531 of FIG. 5*a* is applied.

Returning again to FIG. 5*a*, the middle part of FIG. 5*a* represents a state machine 532 that can use an edge of the PWM control signal to start a burst of pulses, and can also use the shunt_dig signal to stop a pulse. This is another implementation of adaptive control. As shown in the figure, a burst is started by setting the burst-enable signal to 1 when either: VCC_LB=1 or "PWM turn-off". That is, when either the voltage on the positive output voltage rail becomes too low or when a falling edge of the PWM control signal occurs. For this state machine 532, a burst is stopped by setting the burst-enable signal to 0 when either VCC_UB=1 or shunt_dig=1. That is, when the voltage on the positive output voltage rail becomes too high or when the shunt regulator become active, which represents the value of VEE being too low. In this way, the state machine 532 can also use the state of the shunt regulator to end a burst.

FIG. 5*d* shows a plot of VCC, with reference to VCC_UB and VCC_LB, when the middle state machine 532 of FIG. 5*a* is applied. When compared with the plot of FIG. 5*c*, it can be seen that an advantage of the middle state machine 532 is that VCC has a time-averaged value that is in the middle of the hysteresis band. As can be seen from FIG. 5*d*, the ripple in VCC is between VCC_UB and VCC_LB.

As indicated at various points above, alternative feedback signals can be used by the secondary-side controller in other examples. In one such example, the feedback voltage is representative of a measured voltage of the negative output rail (VEE). The controller (either the primary-side controller or the secondary-side controller, or a combination of the two) can then either:

- start the burst in response to either:
  - i) a rising edge of the PWM control signal, or
  - ii) the feedback voltage (VEE) being greater than an upper threshold (VEE_UB). That is, when the feedback voltage (VEE) is not negative enough; and
- stop the burst in response to the feedback voltage (VEE) dropping below a lower threshold (VEE_LB). That is, when the feedback voltage (VEE) is too negative.

In addition, in such an example the shunt regulator of FIG. 1 may be associated with VCC instead of with VEE (as shown in FIG. 1). In which case the shunt regulator can provide a shunt_dig signal that is used by the controller such that it can stop the burst in response to, either:

- the feedback voltage (VEE) being greater than the upper threshold; or
- the shunt_dig signal having a value that represents that the shunt regulator is active.

Figure 6:
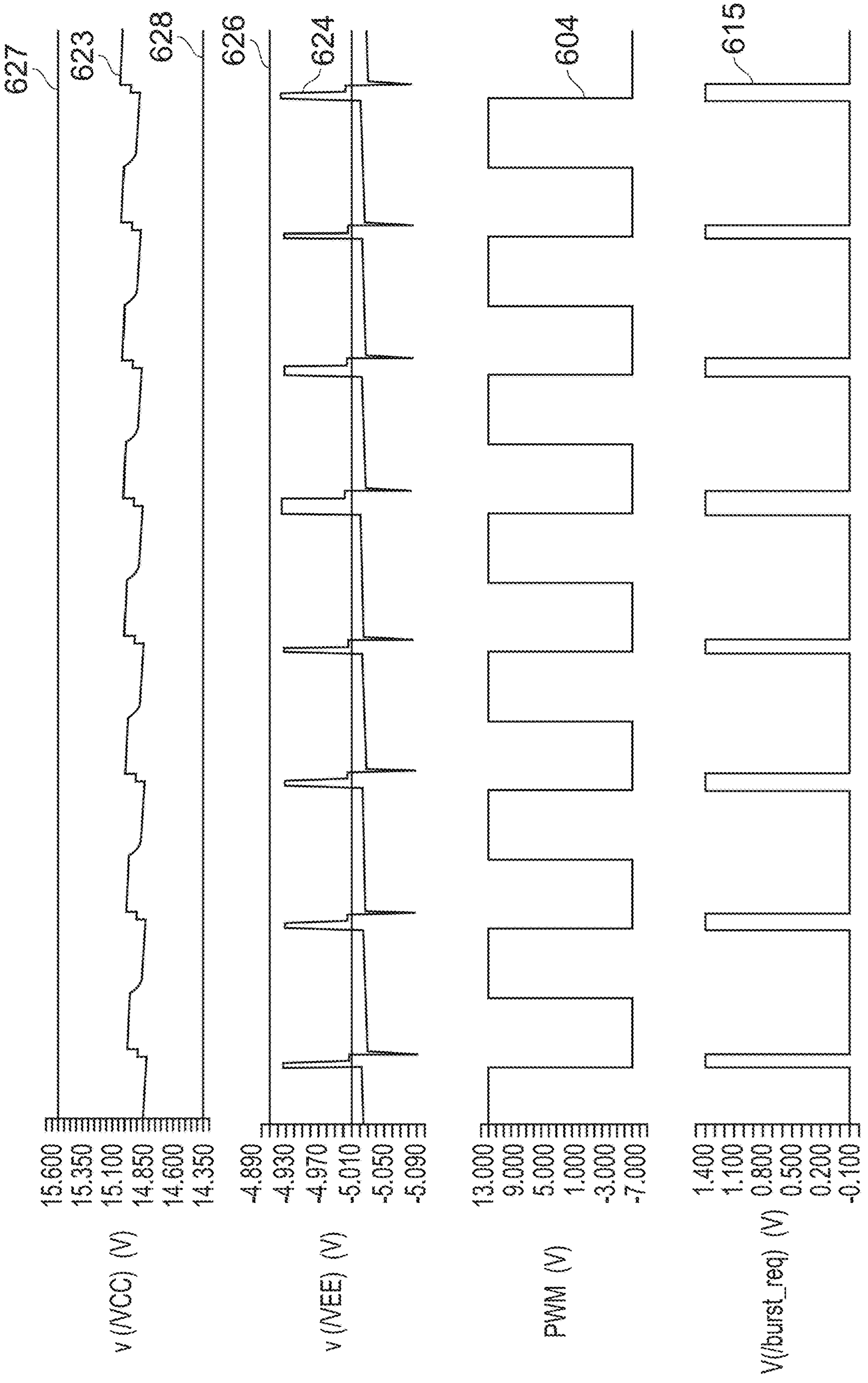
FIG. 6 shows a plot of the signals in the gate driver circuit of FIG. 1, which is similar to the plot of FIG. 4 but this time with adaptive control.

FIG. 6 shows a plot of the signals in the gate driver circuit of FIG. 1, which is similar to the plot of FIG. 4 but this time with adaptive control. That is, an edge of the PWM control signal is used to start or stop a burst.

The plots in FIG. 6 show:

- VCC 623, along with: a plot 627 that shows the upper band (VCC_UB) of the hysteretic control of VCC; and a plot 628 that shows the lower band (VCC_LB) of the hysteretic control of VCC;
- VEE 624, along with: a plot that shows the setpoint of VEE of −5V; and a plot 626 that shows the 2% ripple performance target;
- the PWM control signal 604; and
- the burst-enable signal 615.

FIG. 6 shows that the adaptive control causes flyback activity and ripple resolution after each PWM falling edge (that is, there is a burst of pulses in response to every falling edge in the PWM control signal 604, in contrast to FIG. 4). Therefore, the use of adaptive control results in VEE 644 not exceeding the 2% permitted error amplitude 626.

Figure 7:
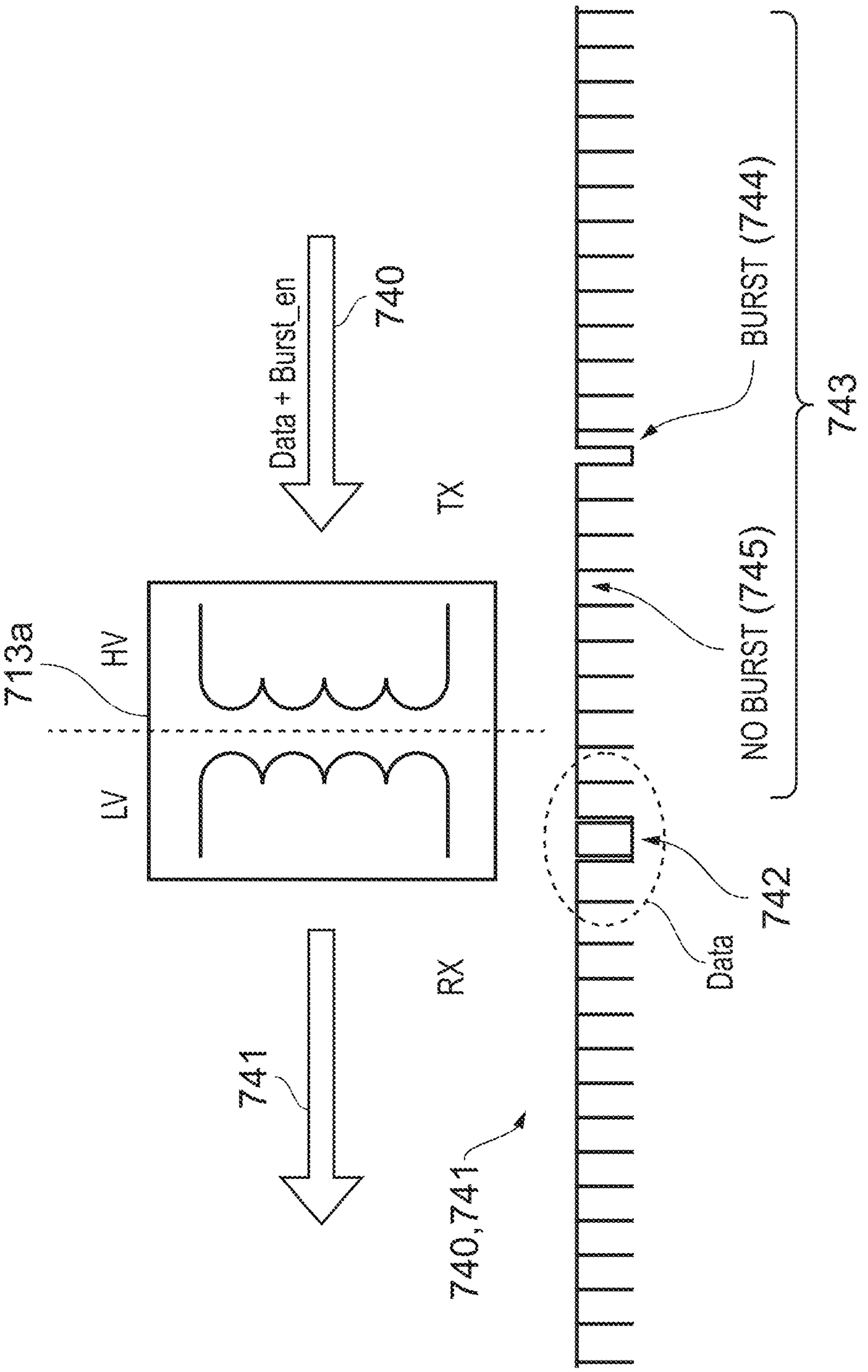
FIG. 7 shows an example embodiment of (at least part of) a galvanically-isolated communication layer, such as the one that is shown in FIG. 1.

FIG. 7 shows an example embodiment of (at least part of) a galvanically-isolated communication layer 713*a*, such as the one that is shown in FIG. 1. The galvanically-isolated communication layer 713*a* receives input signalling 740 from a secondary-side controller (not shown in FIG. 7), and provides output signalling 741 to a primary-side controller (also not shown in FIG. 7). The lower part of FIG. 7 shows an example plot of the input/output signalling 740, 741 that is communicated by the galvanically-isolated communication layer 713*a*.

In this example, the secondary-side controller determines a burst-enable signal. In the same way as discussed above, the burst-enable signal is a binary signal that has a value of 0 when a burst of pulses should be provided as the primary-side switch control signal. The burst-enable signal has a value of 1 when a burst of pulses should not be provided as the primary-side switch control signal. An advantage associated with this choice of polarity is safety related, although it will be appreciated the polarity of the burst-enable signal can be reversed.

The secondary-side controller sends the determined burst-enable signal to the primary-side controller via the galvanically-isolated communication layer 713*a* such that it is time division multiplexed with other data. This other data is identified in the lower part of FIG. 7 with reference 742. The other data 742 can represent a measurement associated with the secondary side of the flyback converter, such as a measured temperature. The burst-enable signal 743 is time division multiplexed with the other data 742 in this example by setting the idle state of the input/output signalling 740, 741 that passes through the galvanically-isolated communication layer 713*a* as either a: high value 744, which represents an instruction to the primary-side controller that a burst of pulses should not be provided to the primary switch; or low value 744, which represents an instruction to the primary-side controller to provide a burst of pulses to the primary switch.

In this way, an existing digital isolated communication channel (such as the galvanically-isolated communication layer 713*a* that is shown in FIG. 7) can be used to send data back to the primary/low-voltage (LV) side, but now with a primary burst command encoded into it by means of setting its idle state. When the idle state is low, the LV side will begin bursting the primary switch. When the idle state is high, the LV side will stop bursting the primary switch. Advantageously, such an example provides feedback from the isolated output voltage to the low voltage side by multiplexing an existing isolated data channel with a command to either drive or not drive the LV side primary switch.

For the example signal 740, 741 in FIG. 7, in between the "other data" 742 there are periodic narrow pulses. These narrow pulses can be referred to as a so-called "heartbeat"; i.e., a signal that the secondary-side controller 112 sends to the primary-side controller to inform it that the secondary-side controller 112 is "alive". Such a heartbeat signal can also be referred to as "other data" with which the burst-enable signal is multiplexed.

It will be appreciated that in other examples, the burst enable signal may be communicated from the secondary side to the primary side using a dedicated channel for the burst enable command.

In a further alternative implementation, as indicated above and as illustrated in FIG. 1 with reference 104*a*, the LV side controller can process the PWM control signal on the LV side to start a burst, in response to seeing a PWM edge during an ongoing data transmission. Beneficially, this can avoid a delay associated with the time division multiplexing that is described with reference to FIG. 7.

Returning to FIG. 1, advantageously the flyback transformer 107 includes a single secondary winding. This is in contrast to a flyback transformer that includes a secondary split winding/coil. Such a secondary split winding does not allow any change of VCC to VEE ratio during operation, and therefore is less flexible than the flyback converter 101 of FIG. 1. Also, use of a secondary split winding will require an additional rectifier diode in the BOM.

Beneficially, the flyback hysteretic control that has been implemented, an example of which is shown in FIG. 1, can have an internal VEE shunt regulator that allows maximum flexibility in regulated voltage settings and BOM choices. It can also cope with a wide range of BOM combinations, while still achieving an acceptable percentage ripple performance on the VEEREG output voltage. This can be due to the application of adaptive control that is shown by the middle and right-most state machines in FIG. 7. This can provide great advantages in terms of PCB BOM, in that one or more of the following may not be required: extra BOM components for flyback compensation, split coil solutions for VEE regulations, or auxiliary windings to provide feedback. As described, the state machine can use pre-knowledge of the upcoming loading on the flyback output by means of monitoring the PWM control signal on the LV side, and bursting the primary even before the output voltage crosses a hysteretic band.

The components of FIG. 1 can be summarised as follows:

- On the low voltage (LV) microprocessor side:
  - Primary side of flyback transformer
  - External low side transistor to drive primary
  - Shunt resistor to sense primary current
- On the high voltage (HV) inverter side:
  - Secondary side of flyback transformer
  - Diode and capacitors for split rail isolated output voltage.
- Integrated in Gate Driver Device (on the LV side):
  - Driver stage for the external low side transistor
  - Gate Control Digital logic
  - Current sense amplifier
  - LV side control logic
  - Galvanic Communication Receiver
- Integrated in Gate Driver Device (on the HV side):
  - Resistor ladders to sense VCC to GND and set hysteretic bands
  - Synchronous Finite State Machine
  - Comparators to sense resistor ladders and create UB and LB signals
  - VEEREG Shunt regulator to create the split rail supply
  - Galvanic Communication Transmitter
  - VCCREG LDO (post regulate the positive rail on the isolated side)

It will be appreciated that the examples disclosed herein can be also implemented in a number of different configurations, such as one or more of: closing the loop on the negative output (VEE); implementing shunt on VCC; LDO on VEE; variants of the regulators that are shown in FIG. 1; working on PWM rising edge instead of falling edge. As a further alternative, other conditions can be used to stop a burst request, such as when a count of the flyback bursts reaches a predetermined value, for example.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A driver circuit for controlling a high-power switch, the driver circuit comprising:
- a flyback converter, comprising:
  - a primary switch;
  - a positive output rail, which is configured to provide a positive output voltage;
  - a negative output rail, which is configured to provide a negative output voltage; and
- a controller configured to:
  - receive a PWM control signal, which is for controlling the high-power switch;
  - receive a feedback voltage signal, representative of a measured voltage of the positive output rail or the negative output rail; and
  - provide a primary-side switch control signal that comprises a bursts of pulses for operating the primary switch, wherein the controller is configured to start a burst of pulses in response to an edge of the PWM control signal, and stop the burst of pulses in response to the feedback voltage crossing a threshold;
- a driving stage that is connected between the positive output rail and the negative output rail, wherein the driving circuit is configured to provide a high-power switch control signal for controlling the state of the high-power switch based on the PWM control signal.

2. The driver circuit of claim 1, wherein:
- the feedback voltage is representative of a measured voltage of the positive output rail; and
- the controller is configured to:
  - start the burst in response to either:
    - i) a falling edge of the PWM control signal, or
    - ii) the feedback voltage being less than a lower threshold, and
  - stop the burst in response to the feedback voltage exceeding an upper threshold.

3. The driver circuit of claim 2, wherein the controller is configured to:
- receive a flyback clock signal;
- provide a burst-enable signal, which is: set to a first value when the controller starts a burst; and is set to a second value when the controller stops a burst; and
- selectively provide the flyback clock signal as the primary-side switch control signal for the primary switch based on the value of the burst-enable signal.

4. The driver circuit of claim 2, wherein the primary switch is connected in series with the primary winding of the flyback transformer between a voltage source for the primary side and a reference terminal.

5. The driver circuit of claim 2, wherein the flyback converter comprises:
- a flyback transformer that has a primary winding and a secondary winding; and
- a shunt regulator that is configured to provide the negative output voltage as a regulated version of a negative voltage at the secondary winding of the flyback transformer.

6. The driver circuit of claim 5, wherein the flyback converter further comprises:
- an LDO voltage regulator that is configured to provide the positive output voltage as a regulated version of a positive voltage at the secondary winding of the flyback transformer.

7. The driver circuit of claim 5, wherein the controller is further configured to:
- receive a shunt-active-signal that represents whether or not the shunt regulator is active; and
- stop the burst in response to either:
  - the feedback voltage exceeding the upper threshold; or
  - the shunt-active-signal having a value that represents that the shunt regulator is active.

8. The driver circuit of claim 6, wherein the controller is further configured to:
- receive a shunt-active-signal that represents whether or not the shunt regulator is active; and stop the burst in response to either:
the feedback voltage exceeding the upper threshold; or
the shunt-active-signal having a value that represents that the shunt regulator is active.

9. The driver circuit of claim 1, wherein:
the feedback voltage is representative of a measured voltage of the negative output rail; and
the controller is configured to:
start the burst in response to either:
i) a rising edge of the PWM control signal, or
ii) the feedback voltage being greater than an upper threshold; and
stop the burst in response to the feedback voltage dropping below a lower threshold.

10. The driver circuit of claim 9, wherein the controller is configured to:
receive a flyback clock signal;
provide a burst-enable signal, which is: set to a first value when the controller starts a burst; and is set to a second value when the controller stops a burst; and
selectively provide the flyback clock signal as the primary-side switch control signal for the primary switch based on the value of the burst-enable signal.

11. The driver circuit of claim 9, wherein the primary switch is connected in series with the primary winding of the flyback transformer between a voltage source for the primary side and a reference terminal.

12. The driver circuit of claim 1, wherein the controller is configured to:
receive a flyback clock signal;
provide a burst-enable signal, which is: set to a first value when the controller starts a burst; and is set to a second value when the controller stops a burst; and
selectively provide the flyback clock signal as the primary-side switch control signal for the primary switch based on the value of the burst-enable signal.

13. The driver circuit of claim 12, wherein the primary switch is connected in series with the primary winding of the flyback transformer between a voltage source for the primary side and a reference terminal.

14. The driver circuit of claim 12, wherein:
the flyback converter has a primary side and a secondary side;
the controller comprises a primary-side controller on the primary side of the flyback converter;
the controller comprises a secondary-side controller on the secondary side of the flyback converter; and
the driver circuit further comprises a galvanically-isolated communication layer that is configured to communicate signalling from the secondary-side controller to the primary-side controller.

15. The driver circuit of claim 14, wherein the secondary-side controller is configured to:
determine the burst-enable signal; and
send the determined burst-enable signal to the primary-side controller via the galvanically-isolated communication layer.

16. The driver circuit of claim 15, wherein the secondary-side controller is configured to:
send the determined burst-enable signal to the primary-side controller via the galvanically-isolated communication layer such that it is time division multiplexed with other data.

17. The driver circuit of claim 15, wherein the other data represents a measurement associated with the secondary side.

18. The driver circuit of claim 1, wherein the flyback converter comprises:
a flyback transformer that has a primary winding and a single secondary winding.

19. The driver circuit of claim 18, wherein the flyback converter comprises:
a positive rail capacitor;
a negative rail capacitor; and
a diode;
wherein, either:
the positive rail capacitor and the diode are connected in series with each other between a first terminal of the secondary winding of the flyback transformer and a reference terminal; and
the negative rail capacitor is connected in series between a second terminal of the secondary winding of the flyback transformer and the reference terminal; or
the positive rail capacitor is connected in series between a first terminal of the secondary winding of the flyback transformer and a reference terminal; and
the negative rail capacitor and the diode are connected in series with each other between a second terminal of the secondary winding of the flyback transformer and the reference terminal.

20. The driver circuit of claim 1, wherein the primary switch is connected in series with the primary winding of the flyback transformer between a voltage source for the primary side and a reference terminal.

* * * * *